US009465057B2

(12) United States Patent
Aerts

(10) Patent No.: US 9,465,057 B2
(45) Date of Patent: Oct. 11, 2016

(54) CURRENT MEASURING CIRCUIT FOR PROVIDING A CURRENT FLOW SIGNAL INDICATIVE OF CURRENT FLOW BETWEEN TERMINALS

(71) Applicant: NXP B.V., Eindhoven (NL)

(72) Inventor: Steven Aerts, Oud-Heverlee (BE)

(73) Assignee: NXP B.V., Eindhoven (NL)

( * ) Notice: Subject to any disclaimer, the term of this patent is extended or adjusted under 35 U.S.C. 154(b) by 196 days.

(21) Appl. No.: 14/450,002

(22) Filed: Aug. 1, 2014

(65) Prior Publication Data

US 2015/0061643 A1    Mar. 5, 2015

(30) Foreign Application Priority Data

Aug. 27, 2013  (EP) .................................. 13181895

(51) Int. Cl.
*G01R 19/00* (2006.01)
*G01R 15/08* (2006.01)
*G01R 1/20* (2006.01)

(52) U.S. Cl.
CPC ........... *G01R 19/0092* (2013.01); *G01R 15/08* (2013.01); *G01R 1/203* (2013.01); *H03K 2217/0027* (2013.01)

(58) Field of Classification Search
CPC ................. H02J 7/0026; H02J 7/0016; H02J 2009/007; H02J 7/04; H02J 7/045; H02J 3/28; G01R 15/08; G01R 19/0092; G01R 1/203; G01R 35/005; H03F 1/0211; H03F 1/0261; H03F 2200/411; H03F 2200/504; H02M 5/12; H02M 1/36; H02M 2001/0003; H02M 2007/2195; H02M 3/33507; H02M 7/493; H02H 7/04; G06F 13/4022; G06F 13/4081; G06F 1/3287; G06F 1/3296; H03K 2217/0027; H03K 5/08
See application file for complete search history.

(56) References Cited

U.S. PATENT DOCUMENTS

| | | | |
|---|---|---|---|
| 4,553,084 A | * | 11/1985 | Wrathall ................ G01R 17/06 323/314 |
| 7,009,403 B2 | | 3/2006 | Graf et al. |
| 7,852,148 B2 | | 12/2010 | Massie et al. |
| 7,952,333 B2 | | 5/2011 | Heppenstall |
| 2011/0198587 A1 | | 8/2011 | Takeuchi |
| 2014/0167797 A1 | | 6/2014 | Aerts |
| 2014/0176120 A1 | | 6/2014 | Aerts |

FOREIGN PATENT DOCUMENTS

| | | |
|---|---|---|
| DE | 198 12 920 A1 | 12/1999 |
| DE | 102 58 766 A1 | 7/2004 |
| EP | 2746890 | 6/2014 |
| EP | 2747285 | 6/2014 |
| GB | 2 428 301 A | 1/2007 |

OTHER PUBLICATIONS

NXP B.V., "AN10322, Current Sensing Power MOSFETS, Application Note, Rev. 02", 10 pgs.(Jun. 24, 2009).
Extended European Search Report for EP Patent Appln. No. 13181895.7 (Feb. 26, 2014).

* cited by examiner

*Primary Examiner* — Vinh Nguyen

(57) ABSTRACT

A current measuring circuit for providing a current flow signal indicative of current flow between a first terminal and a second terminal includes a main transistor, a sense transistor, a bypass switch, an output amplifier for providing a current flow signal, and a controller for enabling current flow through each of respective drain-source paths of the main and sense transistors or a controllable conduction path of the bypass switch.

14 Claims, 3 Drawing Sheets

CURRENT MEASURING CIRCUIT FOR PROVIDING A CURRENT FLOW SIGNAL INDICATIVE OF CURRENT FLOW BETWEEN TERMINALS

CROSS-REFERENCE TO RELATED APPLICATIONS

This application claims the priority under 35 U.S.C. §119 of European patent application no. 13181895.7, filed on Aug. 27, 2013, the contents of which are incorporated by reference herein.

This disclosure relates to a current measuring circuit for providing a current flow signal indicative of current flow between a first terminal and second terminal. In particular, although not exclusively, this disclosure relates to a current measuring circuit comprising a current sensing power field effect transistor (FET).

Circuitry that can determine the amount of current flowing in a load is required in many applications. Current measuring circuitry may be required to detect current levels that would be potentially damaging to electronic components, such as current levels that could cause overheating. Once determined, the current levels can be controlled accordingly.

According to a first aspect of the invention there is provided a current measuring circuit for providing a current flow signal indicative of current flow between a first terminal and second terminal, comprising:

- a main transistor having a main drain, a main source and a main gate, wherein the main source and the main drain define a main source-drain path, the main drain is connected to the first terminal, the main source is connected to the second terminal and the main gate is connected to a first control terminal;
- a sense transistor having a sense drain, a sense source and a sense gate, wherein the sense source and the sense drain define a sense source-drain path, the sense drain is connected to the first terminal and the sense gate is connected to the first control terminal;
- a bypass switch having:
  - a controllable conduction path connected in parallel with the sense drain-source path of the main transistor between the first and second terminals; and
  - a second control terminal for enabling or preventing a current flow through the controllable conduction path;
- an output amplifier having:
  - an input connected to both the sense source of the sense transistor and the controllable conduction path of the bypass switch; and
  - an output for providing the current flow signal; and
- a controller configured to set, in accordance with the current flow signal, a first control signal for the first control terminal and a second control signal for the second control terminal in order to enable current flow through either:
  - each of the respective drain-source paths of the main and sense transistors; or
  - the controllable conduction path of the bypass switch.

By providing a bypass switch in parallel with the main and sense transistors, high currents can be measured by one path and low currents by a second path. The range of current values provided to the input of the output amplifier can be less than the range of current values that are measured, and therefore the dynamic range of the output amplifier may be reduced. The complexity of the amplification required can therefore be reduced. Conversely, the precision of the amplifier over the dynamic range can be improved. Also, as a common amplifier is used by both paths, the complexity of the circuit may be reduced.

The controller may be configured to, if current flow through the controllable conduction path is enabled, set the first control signal in order to enable current flow through each of the respective drain-source paths of the main and sense transistors and set the second control signal in order to prevent current flow through the controllable conduction path of the bypass switch when the current flow signal becomes greater than a first threshold. The controller may be configured to, if current flow through each of the respective drain-source paths of the main and sense transistors is enabled, set the first control signal in order to prevent current flow through each of the respective drain-source paths of the main and sense transistors and set the second control signal in order to enable current flow through the controllable conduction path of the bypass switch when the current flow signal becomes less than a second threshold.

The controller may be configured to, if the current flow through each of the respective drain-source paths of the main and sense transistors is enabled, set the first control signal in order to prevent current flow through each of the respective drain-source paths of the main and sense transistors and set the second control signal in order to prevent current flow through the controllable conduction path of the bypass switch when the current flow signal exceeds a third threshold.

The controller may be configured to, subsequent to the third threshold having been exceeded and in response to a user input or after a pre-determined time interval, set the first control signal in order to enable current flow through each of the controllable conduction path of the bypass switch and the respective drain-source paths of the main and sense transistors.

An area of the drain of the main transistor may be at least an order of magnitude greater than the area of the drain of the sense transistor. A sense ratio may be defined as (the area of the drain of the main transistor): (the area of the drain of the sense transistor). The first threshold may be approximately equal to the second threshold divided by the sense ratio.

The main transistor and sense transistor may be provided on the same substrate/die. The main transistor and the sense transistor may be comprised by a current sensing transistor.

The current sensing transistor may be the only "hot" component required by the circuit as the bypass switch is only used for low currents. Safety considerations regarding the use of high current shunt resistors can therefore be avoided because such a high current shunt resistor may not be required.

The current measuring circuit may comprise a sense resistor configured to receive the current flowing through the drain-source path of the sense transistor or the current flowing through the bypass switch. The amplifier may be a voltage amplifier. The amplifier may be configured to amplify a voltage across the sense resistor.

The sense resistor may have a first connection and a second connection. The first connection may be connected to the bypass switch and the sense source of the second transistor. The second connection may be connected to the second terminal.

The current measuring circuit may comprise a control switch having a controllable conduction path. The controllable conduction path may be provided in series between the sense source of the sense transistor and the first connection of the sense resistor.

The current measuring circuit may comprise voltage setting circuitry configured to set a source voltage of the sense transistor in accordance with a source voltage of the main transistor. The control switch may comprise a control terminal. The voltage setting circuitry may comprise a differential amplifier with an inverting input connected to the source of the main transistor, a non-inverting input connected to the source of the sense transistor and an output connected to the control terminal of the control switch.

The amplifier may be a current amplifier. The amplifier may be a single analogue amplifier.

The bypass switch may be a field effect transistor having a source and a drain defining its controllable conduction path.

The main transistor, sense transistor and/or bypass switch may be provided in the same device package. The main transistor, sense transistor and/or bypass switch may be provided on the same die.

There may be provided a vehicle comprising any current measuring circuit disclosed herein.

Embodiments will now be described by way of example with reference to the accompanying figures, in which:

FIG. 2b illustrates an example total current profile and a corresponding output of the current measuring circuit of FIG. 2a.

Figure 1:
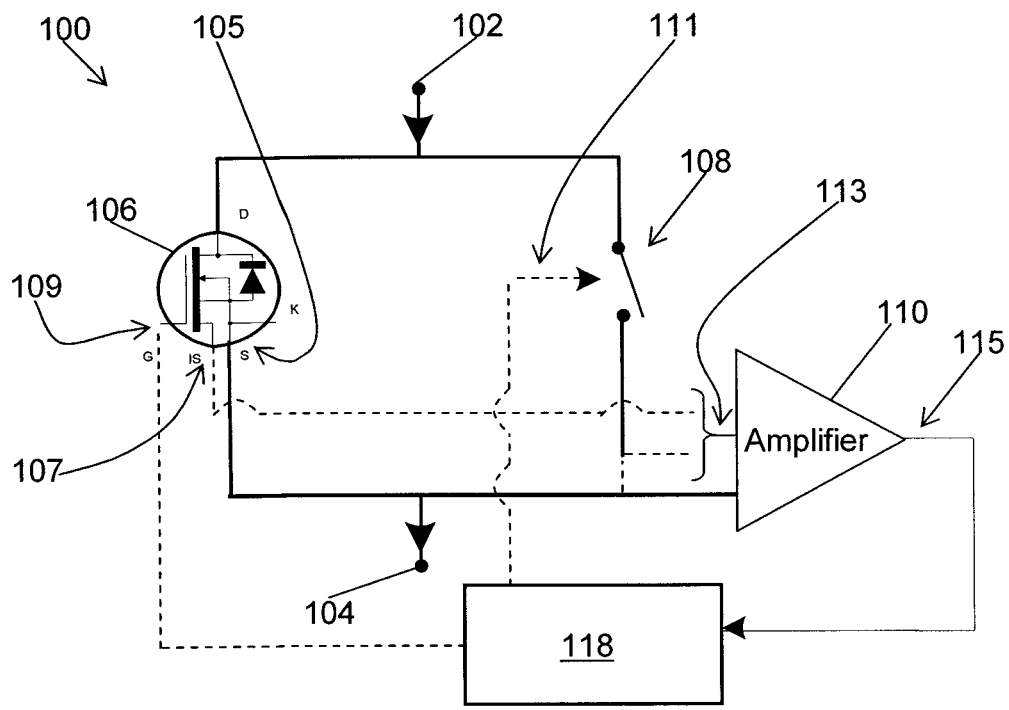
FIG. 1 illustrates a schematic diagram of a current measuring circuit.

Embodiments disclosed herein relate to a current measuring circuit that may be provided as part of an automatic range scaling solution for smart power switches to enable current monitoring across a wide dynamic range. The current measuring circuit can also be used for overload protection when a high current is measured.

Shunt resistors are commonly used in current measuring circuits. In order to minimize voltage drop and power dissipation in the shunt resistor at a rated maximum current, the shunt resistance should be low. Consequently, the voltage measurable across the shunt will be low for small currents. If a wide range of currents need to be measured, the amplification requirements for an output amplifier that amplifies the voltage across the shunt can be beyond what is feasible. This limitation is mainly due to the offset voltage of the output amplifier. State-of-the-art stabilized amplifiers may have offset voltages down to a few microvolts, μV. If high side current sensing is required, as can be required for applications that do not have a split ground, the amplifier must also provide sufficient common mode rejection. High-side current sense amplifiers that have an offset voltage down to a few millivolts, mV, and manual ranging solutions in which a selection is made between one of multiple shunt resistors can be used for multi-meters, may not be sufficient to meet the requirement of providing precise and accurate measurements across a wide current range as demanded in some current measuring applications.

Current sensing transistors, such as current sensing power metal-oxide semiconductor field effect transistors (MOSFETs) provide an effective means of protecting electronic circuits from over-current conditions and offer a low loss method of measuring the load current; in some examples they can eliminate the need for a high current shunt resistor. Such power transistor technology enables switching high currents with low voltage drop and at the same time providing shunt-less measurement of currents according to a fixed sense ratio, n.

A current sensing power MOSFET can include several thousand transistor cells on a common substrate/die arranged in parallel and sharing common drain and gate electrodes. Each transistor cell or element within the current sensing power MOSFET is identical such that current applied at the drain terminal of the current sensing power MOSFET is shared equally between them. In such designs, the source electrodes of several of the transistors are separated from the remaining source electrodes and connected to a separate source terminal. Accordingly, the resulting current sensing MOSFETs can be thought of as equivalent to two transistors in parallel, these having common gate and drain terminals, but separate source terminals. The two transistors may be referred to as a main FET, which comprises the majority of the transistor cells, and a sense FET that comprises much fewer transistor cells. The sense ratio, n, is defined by the drain area of the main FET divided by the drain area of the sense FET. More details on current sensing transistors, which are also known as sensing power transistors, are provided in the NXP application note AN10322 entitled "Current sensing power MOSFETs", rev.02, 24 Jun. 2009, available on the NXP website at http://www.nxp.com/documents/application_note/AN10322.pdf.

For applications in which it is necessary to measure a large range of different currents with a reasonable accuracy, for example 100 μA to 100 A, an amplifier that is connected to the source of the sense FET would need to have a very large dynamic range in order to be able to adequately sense the entire current range. Such amplifiers may be impractical for many applications due to their complexity, insensitivity, power consumption or cost.

FIG. 1 illustrates a schematic diagram of a current measuring circuit 100 for providing, at an output 115, a current flow signal that is indicative of current flow between a first terminal 102 and a second terminal 104. The current measuring circuit 100 comprises a current sensing power transistor 106, a bypass switch 108, an output amplifier 110 and a controller 118.

The provision of the bypass switch 108 in addition to the power transistor 106 allows the current measuring circuit 100 to provide (i) a high current path through the power transistor 106 for measuring relatively high currents; and (ii) a low current path through the bypass switch 108 for measuring relatively low currents. The current through the low and high current paths can be measured by the output amplifier. Such an arrangement allows the dynamic range requirements of the amplifier to be reduced, as discussed below.

The power transistor 106 may be a power FET such as that described in the NXP application note AN10322 and typically comprises many sub-transistors. These sub-transistors can be considered to be grouped as a main transistor and a sense transistor.

The main transistor has a main drain, a main source 105 and a main gate. The main source 105 and the main drain define a main source-drain path. The sense transistor has a sense drain, a sense source 107 and a sense gate. The sense source 107 and the sense drain define a sense source-drain path.

The main drain and the sense drain are each connected to the first terminal 102. The main gate and the sense gate are each connected to a first control terminal 109. The main transistor and the sense transistor are therefore considered to have a common drain (D) and a common gate (G). The first control terminal 109 can receive a first control signal from the controller 118 to enable or prevent a current flow through each of the respective drain-source paths of the power transistor 106.

In use, the sense transistor conducts only a small fraction of current applied to the common drain terminal, the fraction being inversely proportional to the sense ratio, n, which is a current ratio dependent on the ratio of the number of transistor cells in the main transistor to those in the sense transistor (assuming that each transistor has the same drain area). The sense ratio is defined for the condition in which the source terminals 105, 107 of the sense and main transistors are held at the same potential.

In order to determine the current flowing between the first terminal 102 and the second terminal 104, the current at the sense source 107 of the power transistor 106 is measured. This measured current represents the current flowing in the drain-source current path of the sense transistor. The measured current at the sense source 107 of the power transistor 106 can be multiplied by the sense ratio, n, in order to determine the current flow though the drain-source current path of the main transistor. The total current flowing between the first terminal 102 and the second terminal 104 can then be determined as the sum of the currents through the drain-source current path of the sense transistor and the drain-source current path of the main transistor. Where n is large, the total current can be approximated to the current flow in the drain-source path of the main transistor.

The drain-source path of the main transistor is connected between the first and second terminals 102, 104 so that, when the common gate is enabled, a current can flow through the power transistor 106. When current flows through the power transistor 106, the majority of the total current flows through the main transistor and a small fixed fraction of the total current flows through the drain-source path of the sense transistor.

The bypass switch 108 has a controllable conduction path connected in parallel with the drain-source path of the main transistor between the first and second terminals 102, 104. The bypass switch 108 has a second control terminal 111 that can receive a second control signal from the controller 118 in order to enable or prevent a current flow through the controllable conduction path.

In this way two current flow paths are provided in parallel between the first and second terminals 102, 104. In a first current flow path, current flows through the power transistor 106 between the first terminal 102 and the second terminal 104. This may be referred to as a high current path as it is used for carrying a relatively large current. In a second current flow path, current flows through the bypass switch 108 between the first terminal 102 and the second terminal 104. This may be referred to as a low current path as it is used for carrying lower currents.

The controller 118 enables high currents to be measured using the first, high current path in a high current mode of operation and low currents to be measured using the second, low current path in a low current mode of operation by appropriately controlling the bypass switch 108 and the power transistor 106. This operation of the controller 118 results in the output amplifier 110 amplifying a current flowing through the appropriate path such that the total current between the first and second terminals 102, 104 can be determined in an efficient way. In particular, in the high mode of operation, the amplifier amplifies a fraction of the total current that flows between the first terminal 102 and the second terminal 104. This is because the sense transistor taps-off a small fraction of the current that passes through the power transistor 106 in accordance with the sense ratio, n. When the level of the current through the sense transistor gets too low to be adequately amplified by the output amplifier 110, the controller 118 switches to the low current mode of operation such that the current through the bypass switch 208 is presented to the input of the output amplifier 210 instead. After this switchover, the level of the current that is provided to the input of the output amplifier 110 will have increased such that it is sufficiently high for the output amplifier 110 to adequately process.

The output amplifier 110 has an input 113 that is connected to both the low current path and the high current path in order to receive a signal related to the current flowing through the power transistor 106 or the bypass switch 108, depending upon how the first and second control signals that have been set by the controller 118. The input 113 of the output amplifier 110 is amplified with reference to a signal at the second terminal 104. The output amplifier 110 may comprise a common amplifier stage and may be a voltage or current amplifier. The output amplifier 110 also has an output 115 that is configured to provide the current flow signal in accordance with the current flowing in the enabled current path. In this way, a common output amplifier stage may be provided to amplify signals on either the low or high current path. The common output amplifier stage may be a single output amplifier 110.

The controller 118 is configured to determine whether to operate in the high power mode of operation or the low power mode of operation in accordance with the current flow signal provided at the output 115 of the amplifier 110. The controller 118 is configured to enable current flow either: (i) through each of the respective drain-source paths of the main and sense transistors (the high current path) by setting the first control signal for the first control terminal 109 in the high current mode of operation; or (ii) through the controllable conduction path of the bypass switch 108 (the low current path) by setting the second control signal for the second control terminal 111 in the low current mode of operation. It will be appreciated that the power transistor 106 and the bypass switch 108 should be controlled such that they are not both enabled at the same time as this would cause some current to flow in each path.

The controller 118 is also configured to disable current flow through both the low current path and the high current path if the current flowing between the first and second terminals 102, 104 reaches, or exceeds, a maximum current level. The controller can subsequently reinitiate current flow through the high current path after a pre-determined time interval has elapsed, or in response to a user input. In this way, the current measuring circuit can act as a resettable fuse. The operation of the controller is discussed further below in relation to FIGS. 2a, 2b and 3.

Figure 2A:
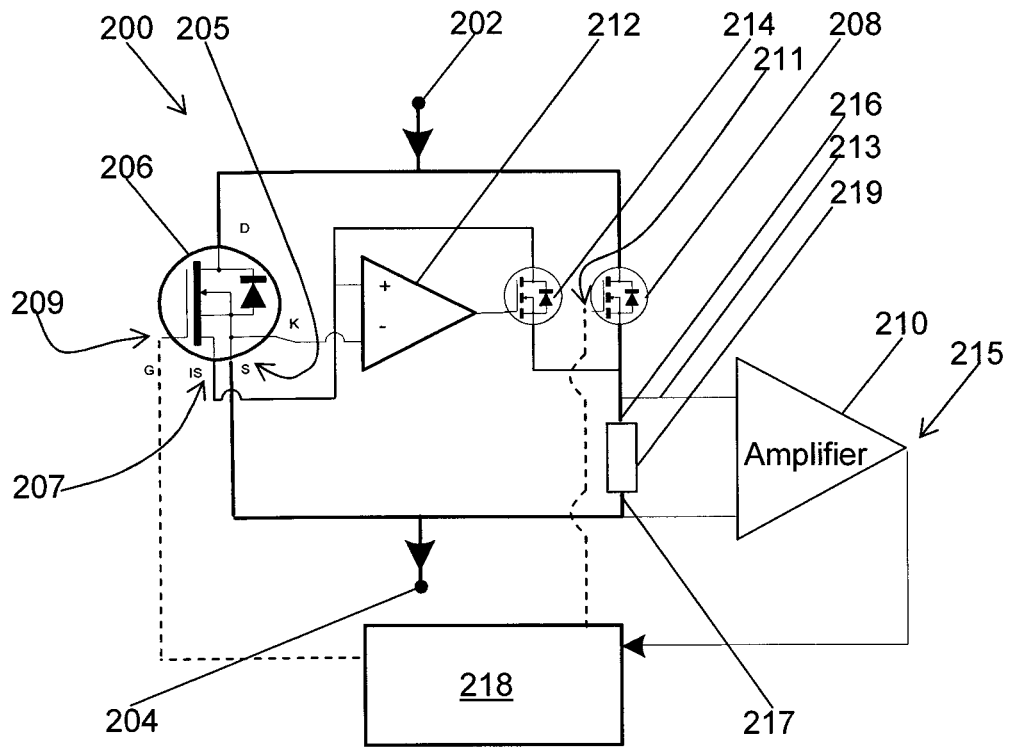
FIG. 2a illustrates a circuit diagram of another current measuring circuit.

FIG. 2a illustrates a circuit diagram of another current measuring circuit 200. Many of the elements of the current measuring circuit 200 are similar to those of the current measuring circuit of FIG. 1a and will not necessarily be discussed again with reference to FIG. 2a. In general, similar components between figures are assigned reference numerals in corresponding series.

The main source 205 of the main transistor comprises two contacts: a high current source contact (S), and a Kelvin source contact (K). The high current source contact (S) may be provided by an impedance such as a bond wire such that it can handle relatively high currents. The Kelvin source contact (K) is connected to the main source terminal 205 of the main transistor in order to provide an accurate determination of the main transistor source potential.

The bypass switch 208 is provided by a bypass transistor, which in this example is a field effect transistor (FET) but may also be provided as a bipolar junction transistor. The bypass switch 208 has a second control terminal 211 that is provided by a gate of the bypass FET in this example.

The current measuring circuit 200 also comprises a differential amplifier 212 (in addition to the output amplifier 210 described with reference to FIG. 1), a control switch 214 and a sense resistor 219. The sense resistor 219 is used because in this example the output amplifier 210 is a voltage amplifier. It will be appreciated that the sense resistor 219 will not be required if a current amplifier is used instead.

The sense resistor 219 is configured to receive the current flowing through the drain-source path of the sense transistor or the current flowing through the bypass switch 208, depending upon which of the low or high current paths is enabled. The sense resistor 219 has a first connection 216 and a second connection 217. The first connection 216 of the sense resistor 219 is connected to the drain of the bypass FET 208 and is also, as discussed in further detail below, selectably connected to the sense source 207 of the sense transistor. The second connection 217 of the sense resistor 219 is connected to the second terminal 204 of the current measuring circuit 200. The voltage dropped across the sense resistor 219 is therefore proportional to the current flowing between the first terminal 202 and the second terminal 204 through either the power transistor 206 or the bypass FET 208, depending on whether the current measuring circuit 200 is operating in the high current mode or the low current mode. The controller 218 determines in which mode to operate in accordance with the output current signal 242, as discussed below with reference to the example of FIG. 2b.

The output amplifier 210, which is a voltage amplifier in this example, is configured to amplify the voltage drop across the sense resistor 219 and provide at its output 215 the current flow signal.

The controller 218 is configured, in the high current mode, to enable current flow through the high current path provided by the power transistor 206 by setting the first control signal for the first control terminal 209. The controller 218 is also configured, in the high current mode, to prevent current flow through the low current path (provided by the bypass switch 108) by setting the second control signal for the second control terminal 111 accordingly.

In the high current mode, a voltage, $V_{high}$, dropped across the sense resistor 219 is:

$$V_{high} = R \cdot I_{SENSE} = R \cdot I_{1-2}/n$$

where R is the resistance of the sense resistor 219, $I_{SENSE}$ is the drain-source current through the sense transistor, $I_{1-2}$ is the total current flowing between the first terminal 202 and the second terminal 204 and 'n' is the sense ratio of the power transistor 206. That is, in the high current mode, the voltage dropped across the sense resistor 219 is proportional to the total current divided, or scaled, by the sense ratio.

The controller 218 is configured, in the low current mode, to enable current flow through the low current path provided by the bypass switch 108 by setting the second control signal for the second control terminal 111. The controller 218 is also configured, in the low current mode, to prevent current flow through the high current path by setting the first control signal for the first control terminal 209 accordingly.

In the low current mode, a voltage, $V_{low}$, dropped across the sense resistor 219 is:

$$V_{low} = R \cdot I_{1-2}$$

That is, in the low current mode, the voltage dropped across the sense resistor 219 is proportional to the total current.

Since $I_{1-2}$ is greater than $I_{SENSE}$, the voltage dropped across the sense resistor 219 will increase when the mode of operation changes from the high current mode to the low current mode. Similarly, the voltage will decrease when changing from the low current mode to the high current mode. In this way, the range of voltage values that are presented to the input of the output amplifier 210 is less than would be the case if only a single current measuring path between the first terminal 202 and the second terminal 204 were used. This is illustrated graphically in FIG. 2b, and described in more detail below.

The sense resistor 219 can have a resistance of a few milliohms to a few ohms, for example, and so results in a low voltage drop. Typically, the resistance of the sense resistor 219 is selected to be lower than the resistance of the drain-source path of the main transistor when it is on (including any bond wires). As a whole, the current measurement circuit 200 may therefore draw a low quiescent current.

The output amplifier 210 provides the current flow signal as an amplifier output signal indicative of the current flow between the first and second terminals 202, 204 of the current measuring device based on the voltage dropped across the sense resistor 219. The output amplifier 210 may be provided by a single analogue amplifier, which may be referred to as a common amplifier because it is common to the current path through the power transistor 206 (high current path) and the current path through the bypass FET 208 (low current path).

Figure 2B:
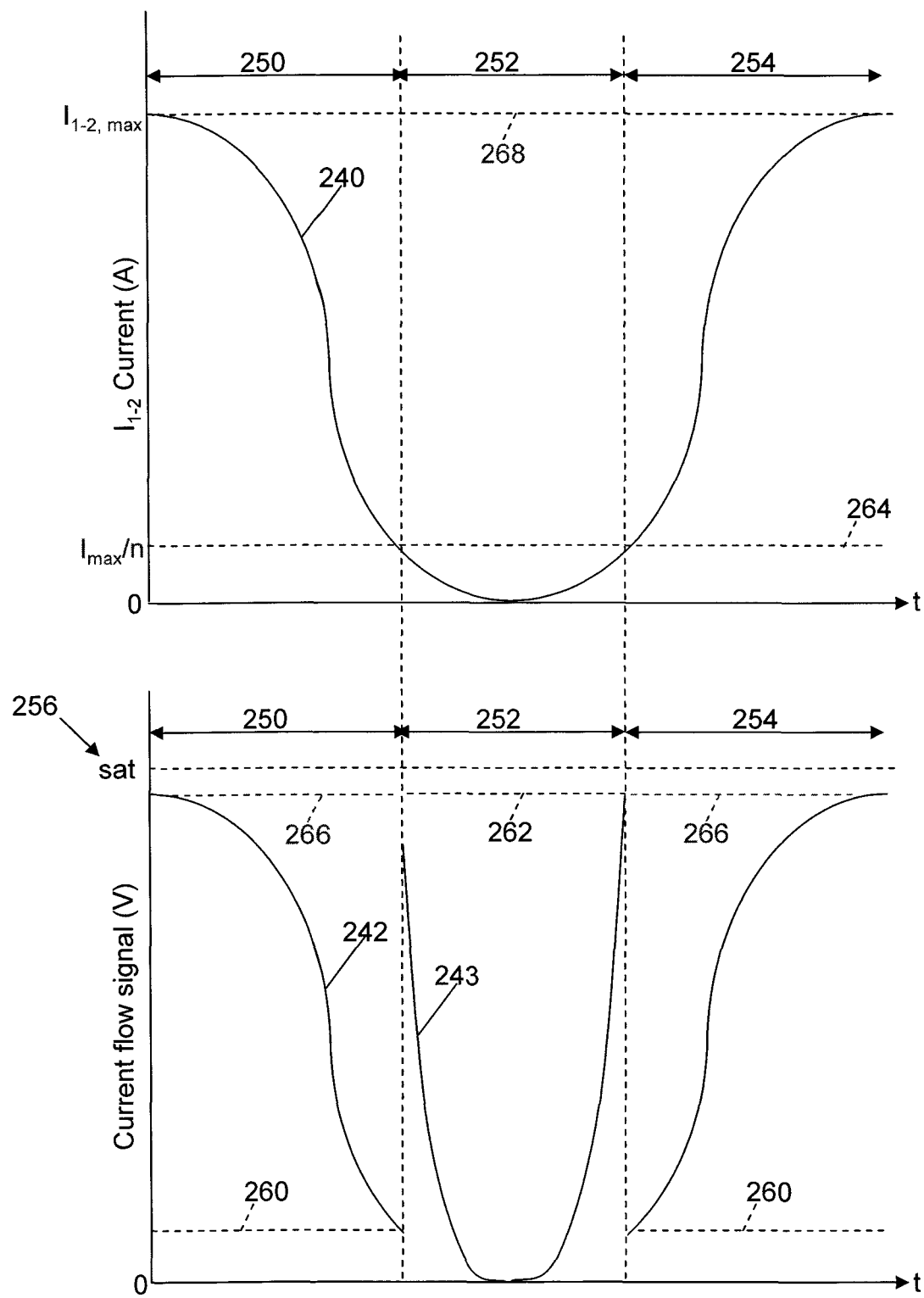

FIG. 2b illustrates, in an upper plot, an example profile 240 of the total current, $I_{1-2}$, flowing between the first and second terminals 202, 204. The total current, $I_{1-2}$, has a range between 0 and $I_{1-2, max}$ amps. A corresponding current flow signal 242, 243 provided by the output 215 of the output amplifier 210 of FIG. 2a is shown in a lower plot. The current flow signal 242, 243 in this example is therefore equal to the voltage dropped across the sense resistor 219 multiplied by a gain, G, of the output amplifier 210 (assuming that the output amplifier is operating in a linear mode).

In this example, the high current mode of operation 250 is applied for a period of time at the start of the profile. The current flow signal 242 in the high current mode of operation is representative of the total current $I_{1-2}$ 240 divided by the sense ratio, n, of the power transistor. That is, in the high current mode, the current flow signal 242 has a voltage, $V_{242}$:

$$V_{242} = G \cdot R \cdot I_{SENSE}$$
$$= G \cdot R \cdot I_{1-2}/n$$

When a high current is flowing it is not appropriate to pass the total current, $I_{1-2}$, through the sense resistor 219 (shunt resistor) because such use could lead to: i) the sense resistor 219 and bypass transistor 208 over-heating, ii) an excessive voltage drop across the sense resistor, or iii) the current exceeding the maximum expected range (saturation threshold) of the output amplifier 210.

The high current mode of operation 250 continues until the current flow signal 242 falls below a first threshold level 260. That is, the controller 218 is configured such that if the circuit is in the high current mode of operation 250, the controller 218 switches to the low current mode of operation 252 when the current flow signal 242 becomes less than the first threshold 260. The first threshold 260 is compared directly with the current flow signal in this example.

In the low current mode of operation, the current flow signal 243 is no longer divided by the sense ratio, n. Therefore, there is a discontinuity in the current flow signal as the mode of operation changes, as can be seen in the lower plot of FIG. 2b.

The circuit remains in the low current mode of operation 252 until the current flow signal 243 rises above a second threshold level 262. That is, the controller 218 is configured such that if the circuit is in the low current mode of operation 252, the controller 218 switches to the high current mode 254 when the current flow signal 243 becomes greater than the second threshold 262. The second threshold 262 is compared directly with the current flow signal in this example. The first and second threshold levels 260, 262 may be set such that hysteresis is provided.

The first threshold level 260 may be set such that the maximum value of the current flow signal 242 in the low current mode of operation 250 is roughly equal (but just lower for hysteresis) to the maximum value of the current flow signal 243 in the high current mode of operation 252.

This can make efficient use of the dynamic range of the output amplifier that will receive the current flow signal. Since the discontinuity in the current flow signal 242, 243 is due to the withdrawal or application of the sense ratio, n, the first threshold can be set as approximately the maximum value of the current flow signal 242 in the high mode of operation 250 divided by the sense ratio, n. That is, the first threshold 260 may be set at a voltage, $V_{260}$ for comparison with the voltage $V_{242}$ of the current flow signal 242 in the high current mode:

$$V_{260} = G.R.I_{SENSE,\ max}/n$$
$$= G.R.I_{1\text{-}2,\ max}/n^2,$$

where $I_{SENSE,\ max}$ is the maximum current that is permitted to flow through the sense transistor and $I_{SENSEmax} = I_{1\text{-}2,\ max}/n$.

The second threshold level 262, which is used when the circuit is in the low current mode of operation 252, may be set such that the circuit changes to the high mode of operation when the current flow signal 242 reaches, or exceeds by a small amount, the maximum value of the current flow signal 242 that occurs immediately when the circuit switches the low current mode of operation. Therefore, the second threshold 262 may be set at a voltage, $V_{262}$ for comparison with the voltage $V_{243}$ of the current flow signal 243 in the low current:

$$V_{262} = G \cdot R \cdot I_{1\text{-}2,max}/n.$$

As shown in the lower plot, the saturation voltage 256 of the amplifier 210 is higher than the maximum levels of the current flow signal in both the high current mode of operation 250, 254 and the low current mode of operation 252. Due to the overlap in the current flow signal because of the discontinuity when changing mode of operation, the saturation voltage 256 can be advantageously less than would be required if the output amplifier received input signals from only a single current path. If the current flow signal exceeds the saturation voltage 256 then the output amplifier 210 would saturate, leading to a loss of accuracy of the output current flow signal.

The controller 218 is further configured to provide current overload protection functionality. That is, when the total current exceeds a max threshold 266, 268 the controller sets a "no current mode" of operation in which current flow through the power transistor and the bypass switch is disabled. That is, the controller 218 is also configured to disable current flow through both the low current path and the high current path if the current flowing between the first and second terminals 202, 204 reaches, or exceeds, a maximum current level, $I_{1\text{-}2,\ max}$.

In FIG. 2b, a max threshold 266 is illustrated with reference to the current flow signal 242 in the high current mode of operation on the lower plot. If the circuit is operating in the high current mode 250, 254 and the current flow signal 242 were to exceed the max threshold 266 then the controller 218 will set the first control signal in order to prevent current flow through each of the respective drain-source paths of the main and sense transistors and will set the second control signal in order to prevent current flow through the controllable conduction path of the bypass switch 208. The max threshold 266 may be set as a voltage, $V_{266}$, that relates to the maximum current level, $I_{SENSE,\ max}$ that can pass in the high current mode 250, 254. That is:

$$V_{266} = G.R.I_{SENSE,\ max}$$
$$= G.R.I_{1\text{-}2,\ max}/n$$

That is, the voltage level $V_{266}$ of the max threshold 266 that is compared with the current flow signal 242 in the high current mode of operation 250 may be the same as the voltage level $V_{262}$ of the second threshold 262 that is compared with the current flow signal 243 in the low current mode of operation 252. It will be appreciated that, even though the max threshold 266 and second threshold 262 have the same voltage levels, they correspond to different values of total current $I_{1\text{-}2}$ as they are applied in different modes of operation.

After the current flow has been prevented in over to stop an overload condition, the controller 218 may subsequently reinitiate current flow through the high current path after a pre-determined time interval has elapsed, or in response to a user input. In this way, the current measuring circuit can act as a resettable fuse.

In an alternative embodiment, the current flow signal may be processed by a controller in accordance with the known mode of operation in order to determine the value of the total current, $I_{1\text{-}2}$, between the first and second terminals 202, 204. Then a single threshold level 264 can be applied to $I_{1\text{-}2}$, as shown in the top plot of FIG. 2b to determine whether the circuit should operate in the high current mode or low current mode of operation. Alternatively, a pair of closely related thresholds can be applied to $I_{1\text{-}2}$ in order to provide hysteresis. Similarly, a max threshold 268 can be applied to the total current, $I_{1\text{-}2}$, to determine whether or not to switch to the "no current mode" of operation. It will be appreciated that the total current, $I_{1\text{-}2}$, 240 is derived from the current flow signal 242, 243 and so comparison of the total current $I_{1\text{-}2}$ 240 with a threshold 264, 268 allows current flow in the circuit to be controlled indirectly in accordance with the current flow signal For a current measurement circuit that has to handle a $10^6$:1 range of currents, and that has a power transistor with a sense ratio, n, of 1000, the dynamic range required of the common output amplifier 210 is reduced to $10^3$:1 by providing the separate low current path and high current paths. This is because the range of current/voltage values that has to be handled by the input 213 of the output amplifier 210 is less than that of the range of current values received at the first terminal 202, as shown in FIG. 2b. The constraints on the design of the output amplifier 210 can therefore be reduced. The current measuring circuit 200 therefore can enable sufficiently accurate and efficient range scalable current sensing using a common output amplifier 210. With calibration, current measurement accuracy within a few percent across the total dynamic range may be achieved. Without calibration, accuracy for high currents may be limited to around 10% due to typical production spread for the sense ratio. Temperature compensation is not typically required in examples where the sense transistor is housed at the same temperature as the main transistor, for example because they are on the same die/substrate.

Returning to FIG. 2a, the differential amplifier 212 is an example of voltage setting circuitry that is configured to set a source voltage of the sense transistor in accordance with a source voltage of the main transistor in order to compensate for differences in potential between the two sources. Such differences might arise due to, for example, losses in the circuit. This arrangement may be referred to as providing a virtual earth. A virtual earth current sensing technique for reading the sense current can provide improved performance in terms of accuracy and noise immunity over the operating temperature range of the current measuring circuit 200.

The differential amplifier 212 has an inverting input connected to the Kelvin source contact (K) of the main source 205 of the main transistor, a non-inverting input connected to the sense source 207 of the sense transistor and an output that is used to control the control switch 214. The differential amplifier 212 maintains equilibrium by minimising or reducing any difference in potential between the signals at its inverting and non-inverting inputs. Therefore, the potential at the sense source 207 of the sense transistor is equalised with the potential at the Kelvin source (K) of the main transistor. In this way, a constant ratio between the current that flows through the drain-source path of the sense transistor and the drain-source path of the main transistor can be maintained and so the sense ratio, n, can be used to accurately calculate the total current from the current flow signal in the high current mode of operation.

The control switch 214 is provided by a control FET in this example, although it will be appreciated that a bipolar transistor could also be used. The control switch 214 has a controllable conduction path provided in series between the source of the sensing FET and the first connection 216 of the sense resistor 219. The control switch 214 provides a path for the sensing current to join up with, or return to, the current that passes through the main transistor and so reduces power losses in the system. The control switch 214 also comprises a control terminal, which in this example is provided by the gate of the control FET. The control terminal is connected to the output of the differential amplifier 212.

The power transistor 206 is the only "hot" component in the circuit as the bypass switch 208 is only operated at low currents. Furthermore, the current through the sensing resistor 219 is less than the total current that passes between the first and second terminals 202, 204 in the high current mode of operation because only a fraction of the total current passes through the sensing resistor 219. A high current shunt resistor and the associated safety considerations is therefore avoided. The provision of only a single "hot" component also advantageously reduces thermal management requirements for the circuit 200.

The current measuring circuit 200 may be used as either a high side measurement circuit, where the first terminal 204 is connected to a power source and the second terminal 206 is connected to a load, or low side measurement circuit, where the first terminal 204 is connected to a load and the second terminal 206 is connected to ground. High side measurement can present an advantage of a common ground. Low side measurement means that the ground of the load is separated from the supply ground by the measurement circuit 200, resulting in a split ground topology. It can be advantageous to avoid having a split ground in order that grounds can be freely interconnected to define a low-noise common signalling reference. However, high side measurement can result in additional complexity for the control circuit because it may require a DC/DC up-converter to drive the control circuit. Generally, low-side measurement may be used in a low-complexity, well-contained system whereas high-side measurement may be advantageous for more complex systems.

Figure 3:
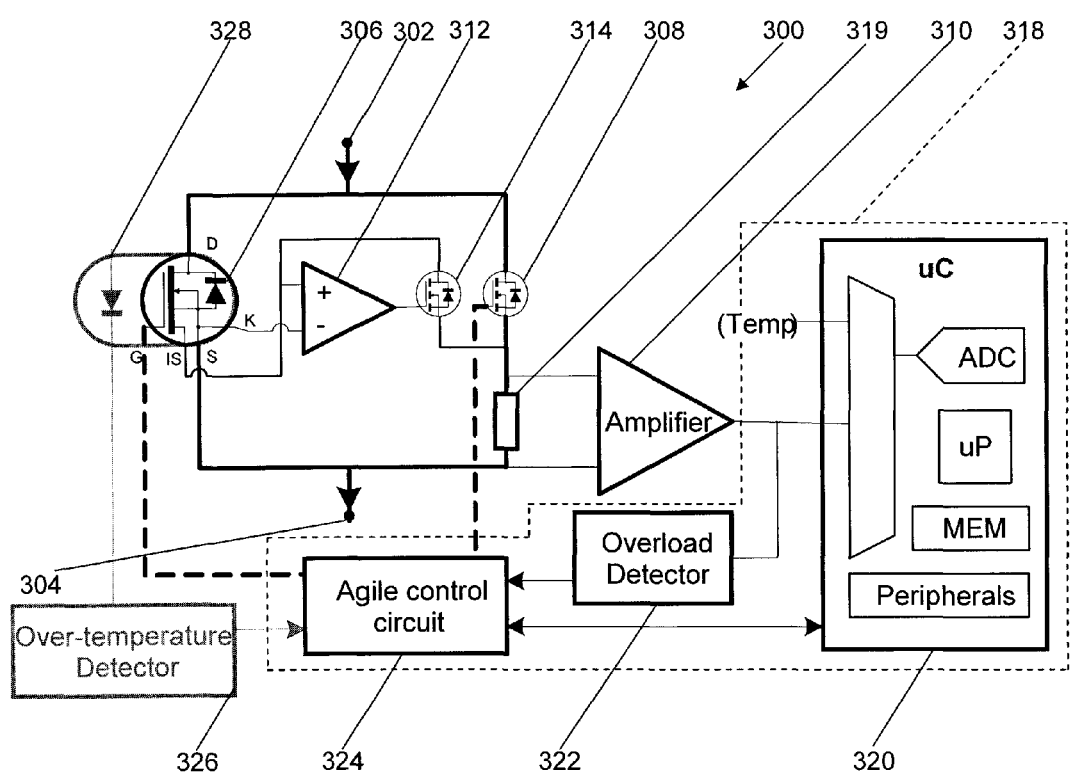
FIG. 3 illustrates a schematic of the current measuring circuit of FIG. 2a and a block diagram of an associated controller.

FIG. 3 illustrates a schematic of a current measuring circuit 300 that is similar to that of FIG. 2a, showing additional details of the controller 318.

The differential amplifier 312, control switch 314 and sense resistor 319 are provided in the same device package in this example. Other components, such as the bypass switch 308 and/or output amplifier 310 may also be provided within the device package. 'Hot' components such as the power transistor 106 may be provided in a separate package. Alternatively, the power transistor 106 may be provided in the same device package as the bypass switch 308 in order to reduce the component footprint. Providing the bypass switch 308 and power transistor 306 in the same package also means that the temperature of these components will be similar and so reduce possible temperature differential effects in measurements. Indeed, the power transistor 306 and the bypass switch 308 may be provided on the same die/substrate.

The controller 318 performs the functions of the controller of FIG. 2 and comprises a microcontroller 320, an overload detector 322 and agile control circuitry 324. The controller 318 may optionally comprise an over-temperature detector 326. The over-temperature detector 326 can be connected to an optional temperature sensor 328, such as a temperature sensing diode provided in the same package as the power transistor 306.

The microcontroller 320 may be provided by conventional hardware such as a multiplexor, an analogue to digital converter (ADC), a microprocessor, memory and other peripherals. The multiplexor receives the current flow signal from the output amplifier 310 and a temperature indication from the temperature sensor 328. The ADC 320 digitizes the current flow signal provided by the amplifier 310. The design constraints on the ADC are also reduced by the provision of the low current path and high current path because the dynamic range of the amplifier output signal is reduced by the sense ratio, as discussed above. The dynamic range of signals that need to be digitized by the ADC is therefore also reduced.

The digitized signal can then be provided as an output of the current monitoring circuit 300. The microcontroller 320 is configured to send commands to the agile control circuit 324 in accordance with the digitized signal. The microcontroller 320 can also receive information from the agile control circuitry 324 that enables the microcontroller 320 to treat the digitized signal in accordance with whether the circuit is in the high current mode of operation or the low current mode of operation. As discussed above, this information may be required in order to correctly interpret the range of the ADC output signal in order to apply a correct scaling factor to the output signal and determine the total current flowing between the first and second terminals 302, 304. Also, the mode of operation should be known in order to apply the correct threshold value.

When initializing, the microcontroller 320 may assume that a high current is passing between the first and second terminals 302, 304 and so command the agile control circuitry to enable the power FET 306 and disable the bypass switch 308. This can be a safety precaution in order to reduce the likelihood of a high current being passed through the sense resistor 319.

The overload detector 322 is configured to receive the current flow signal from the output amplifier 310 and provide an overflow signal to the agile control circuit 324 when the current flow signal is above an overload level. If the current flow signal is above the overload level it means that the current flowing through the sense resistor 319 is too high. The overload detector 322 is therefore provided as dedicated circuitry to ensure that such an overload is stopped as quickly as possible by the agile control circuit 324. If the current flow signal is too high, the overload detector 322 sends an overload signal to the agile control circuit 324 which will either: enable the power FET 306 and disable the bypass switch 308, if the bypass switch 308 was previously enabled; or disable both paths if the power FET 306 was previously enabled.

The microcontroller 320 may command the agile control circuit 324 to enable the bypass switch 308 and disable the power transistor 306 in the case that the power transistor 306 is enabled and the digitized signal falls below a threshold level, indicating that a low current is flowing between the first and second terminals. By changing from measuring the high current path to the low current path, the precision of the measurement can be improved as described above.

The microcontroller 320 may provide the functionality of a switchable fuse. As a switch it can be turned on/off by the microcontroller. As a fuse, if the current exceeds a given threshold, both branches are switched off such that no current flows to the load. The fuse may be reset by the microcontroller after a predetermined period of time or in response to user input.

Any components that are described herein as being "coupled" or "connected" could be directly or indirectly coupled or connected. That is, one or more components could be located between two components that are said to be coupled or connected whilst still enabling the required functionality to be achieved.

The invention claimed is:

1. A current measuring circuit for providing a current flow signal indicative of current flow between a first terminal and a second terminal, comprising:
    a main transistor having a main drain, a main source and a main gate, wherein the main source and the main drain define a main source-drain path, the main drain is connected to the first terminal, the main source is connected to the second terminal and the main gate is connected to a first control terminal;
    a sense transistor having a sense drain, a sense source and a sense gate, wherein the sense source and the sense drain define a sense source-drain path, the sense drain is connected to the first terminal and the sense gate is connected to the first control terminal;
    a bypass switch having:
        a controllable conduction path connected in parallel with the sense drain-source path of the main transistor between the first and second terminals; and
        a second control terminal for enabling or preventing a current flow through the controllable conduction path;
    an output amplifier having:
        an input connected to both the sense source of the sense transistor and the controllable conduction path of the bypass switch; and
        an output for providing the current flow signal; and
    a controller configured to set, in accordance with the current flow signal, a first control signal for the first control terminal and a second control signal for the second control terminal in order to enable current flow through:
        each of the respective drain-source paths of the main and sense transistors; or
    the controllable conduction path of the bypass switch, wherein the controller is configured to:
    if current flow through the controllable conduction path is enabled, set the first control signal in order to enable current flow through each of the respective drain-source paths of the main and sense transistors and set the second control signal in order to prevent current flow through the controllable conduction path of the bypass switch when the current flow signal exceeds a first threshold; and
    if current flow through each of the respective drain-source paths of the main and sense transistors is enabled, set the first control signal in order to prevent current flow through each of the respective drain-source paths of the main and sense transistors and set the second control signal in order to enable current flow through the controllable conduction path of the bypass switch when the current flow signal falls below a second threshold.

2. The current measuring circuit of claim 1, wherein the controller is configured to:
    if current flow through each of the respective drain-source paths of the main and sense transistors is enabled, set the first control signal in order to prevent current flow through each of the respective drain-source paths of the main and sense transistors and set the second control signal in order to prevent current flow through the controllable conduction path of the bypass switch when the current flow signal exceeds a third threshold.

3. The current measuring circuit of claim 2 wherein the controller is configured to, subsequent to the third threshold having been exceeded and in response to a user input or after a pre-determined time interval, set the first control signal in order to enable current flow through each of the controllable conduction path of the bypass switch and the respective drain-source paths of the main and sense transistors.

4. The current measuring circuit of claim 1, wherein a substrate area of the drain of the main transistor is at least an order of magnitude greater than a substrate area of the drain of the sense transistor, wherein a sense ratio between the main transistor and the sense transistor is defined as the substrate area of the drain of the main transistor divided by the substrate area of the drain of the sense transistor.

5. The current measuring circuit of claim 4, wherein the first threshold is approximately equal to the second threshold divided by the sense ratio.

6. The current measuring circuit of claim 1, wherein the main transistor and sense transistor are provided on the same die.

7. The current measuring circuit of claim 6, wherein the main transistor and the sense transistor are comprised by a current sensing transistor.

8. The current measuring circuit of claim 1, comprising a sense resistor configured to receive the current flowing through the drain-source path of the sense transistor or the current flowing through the bypass switch, and wherein the amplifier is a voltage amplifier configured to amplify a voltage across the sense resistor.

9. The current measuring circuit of claim 8, wherein the sense resistor has a first connection and a second connection, wherein the first connection is connected to the bypass switch and the sense source of the sense transistor, and the second connection is connected to the second terminal.

10. The current measuring circuit of claim 9, further comprising:

a control switch having a controllable conduction path provided in series between the sense source of the sense transistor and the first connection of the sense resistor;

voltage setting circuitry configured to set a source voltage of the sense transistor in accordance with a source voltage of the main transistor; and wherein the control switch comprises a control terminal and the voltage setting circuitry comprises a differential amplifier with an inverting input connected to the source of the main transistor, a non-inverting input connected to the source of the sense transistor and an output connected to the control terminal of the control switch.

11. The current measuring circuit of claim 1, wherein the output amplifier is a current amplifier.

12. The current measuring circuit of claim 1, wherein the output amplifier is a single analogue amplifier.

13. The current measuring circuit of claim 12 wherein the main transistor, sense transistor and the bypass switch are provided on the same die.

14. The current measuring circuit of claim 1, wherein the bypass switch is a field effect transistor having a source and a drain defining its controllable conduction path.

* * * * *